US010740688B2

(12) United States Patent
Selvanayagam et al.

(10) Patent No.: US 10,740,688 B2
(45) Date of Patent: Aug. 11, 2020

(54) IMPEDANCE-MATCHED MICROWAVE QUANTUM CIRCUIT SYSTEMS

(71) Applicant: RIGETTI & CO., INC., Berkeley, CA (US)

(72) Inventors: Michael Karunendra Selvanayagam, Oakland, CA (US); Chad T. Rigetti, Emeryville, CA (US); Eyob A. Sete, Walnut Creek, CA (US); Matthew J. Reagor, Corte Madera, CA (US)

(73) Assignee: Rigetti & Co, Inc., Berkeley, CA (US)

( * ) Notice: Subject to any disclaimer, the term of this patent is extended or adjusted under 35 U.S.C. 154(b) by 0 days.

(21) Appl. No.: 15/377,005

(22) Filed: Dec. 13, 2016

(65) Prior Publication Data

US 2018/0232653 A1    Aug. 16, 2018

Related U.S. Application Data

(60) Provisional application No. 62/306,983, filed on Mar. 11, 2016.

(51) Int. Cl.
| | | |
|---|---|---|
| *G06F 15/80* | (2006.01) | |
| *G06N 99/00* | (2019.01) | |
| *H01L 39/02* | (2006.01) | |
| *H01L 39/22* | (2006.01) | |
| *H01P 5/02* | (2006.01) | |

(Continued)

(52) U.S. Cl.
CPC ............ *G06N 10/00* (2019.01); *G06F 15/80* (2013.01); *H01L 27/18* (2013.01); *H01L 39/025* (2013.01); *H01L 39/223* (2013.01); *H01P 5/028* (2013.01); *H01L 39/045* (2013.01); *H01P 1/2013* (2013.01)

(58) Field of Classification Search
CPC ... G06N 99/002; H01L 39/025; H01L 39/223; H01L 27/18; H01L 39/045
USPC .............. 712/1, 223; 438/2; 257/31; 706/10; 326/5; 365/162
See application file for complete search history.

(56) References Cited

U.S. PATENT DOCUMENTS

| | | | |
|---|---|---|---|
| 5,387,864 A | 2/1995 | Gershenson et al. | |
| 9,870,536 B1 * | 1/2018 | Abdo .................. | G06N 99/002 |

(Continued)

FOREIGN PATENT DOCUMENTS

| | | |
|---|---|---|
| WO | 2015057839 | † 4/2015 |
| WO | 2015178990 | 11/2015 |

(Continued)

OTHER PUBLICATIONS

Mutus et al., "Strong environmental coupling in a josephson parametric amplifier," Applied Physics Letters, vol. 104, No. 26, Jul. 2014, 4 pages.

(Continued)

*Primary Examiner* — Ly D Pham
(74) *Attorney, Agent, or Firm* — Henry Patent Law Firm PLLC

(57) ABSTRACT

In a general aspect, a microwave quantum circuit includes an on-chip impedance matching circuit. In some cases, a microwave quantum circuit includes a dielectric substrate, a quantum circuit device on the substrate, and an impedance matching circuit device on the substrate. The quantum circuit device includes a Josephson junction, and the impedance matching circuit device is coupled to the quantum circuit device on the substrate.

43 Claims, 9 Drawing Sheets

(51) Int. Cl.
*G06N 10/00* (2019.01)
*H01L 27/18* (2006.01)
*H01P 1/201* (2006.01)
*H01L 39/04* (2006.01)

(56) References Cited

U.S. PATENT DOCUMENTS

| | | | | |
|---|---|---|---|---|
| 2003/0207766 | A1* | 11/2003 | Esteve | B82Y 10/00 505/190 |
| 2009/0174496 | A1* | 7/2009 | Van Bezooijen | H03F 1/56 333/17.3 |
| 2012/0098594 | A1* | 4/2012 | Zmuidzinas | H03F 7/02 330/4.6 |
| 2013/0043945 | A1* | 2/2013 | McDermott | H03F 3/195 330/188 |
| 2013/0207725 | A1* | 8/2013 | Afshari | H03B 19/00 330/278 |
| 2013/0258595 | A1* | 10/2013 | Tuckerman | H01L 23/3677 361/701 |
| 2014/0266421 | A1* | 9/2014 | Aleman | H03F 7/04 330/4.5 |
| 2015/0028970 | A1† | 1/2015 | Chow et al. | |
| 2015/0241481 | A1* | 8/2015 | Narla | H03F 19/00 324/602 |
| 2016/0191060 | A1† | 6/2016 | McDermott, III et al. | |
| 2016/0308502 | A1† | 10/2016 | Abdo et al. | |
| 2016/0336810 | A1* | 11/2016 | Mortazawi | H02J 50/12 |
| 2017/0092834 | A1* | 3/2017 | Fong | H01L 39/223 |
| 2017/0093381 | A1† | 3/2017 | Abdo | |
| 2017/0222116 | A1* | 8/2017 | Abdo | H01P 3/08 |
| 2018/0138987 | A1* | 5/2018 | Sliwa | G06N 99/002 |

FOREIGN PATENT DOCUMENTS

| | | |
|---|---|---|
| WO | 2015178991 A2 | 11/2015 |
| WO | 2017155531 A1 † | 9/2017 |

OTHER PUBLICATIONS

Roy et al., Broadband parametric amplification with impedance engineering: Beyond the gain-bandwidth product, Applied Physics Letters, vol. 107, No. 26, Dec. 2015.

Roy et al., Broadband parametric amplification with impedance engineering: Beyond the gain-bandwidth product, Applied Physics Letters, vol. 107, No. 26, Feb. 2016.

Hong et al., Microwave Filters for RF/Microwave Applications, 2001, 488 pages.

Pozar, Microwave Engineering, 4th ed., 2012, 756 pages.

EPO, Communication pursuant to Article 94(3) EPC dated Aug. 16, 2018, in EP17153888.7, 7 pgs.

Lentinen , "DC Squid Microwave Amplifier", Master's Thesis, Nov. 16, 2004, 61 pgs.

European Patent Office, Extended European Search Report dated Aug. 3, 2017 in App. No. 17153888.7, 8 pages.

White , et al., "Traveling wave parametric amplifier with Josephson junctions using minimal resonator phase matching", arXiv:1503. 04364v1, Mar. 15, 2015, 15 pgs.

EPO, Comm under Rule 71(3) EPC dated Apr. 17, 2019, in EP 17153888.7, 45 pgs.

EPO, Communication pursuant to Rule 114(2) EPC (Third party observations) dated Jun. 21, 2019, in EP 171538881, 53 pgs.

"Impedance matching", Wikipedia, https://en.wikipedia.org/w/index.php?title=Impedance_matching&oldid=690288951, Nov. 12, 2015, 10 pgs.

"Parametric oscillator", Wikipedia, https://en.wikipedia.org/w/index.php?title=Parametric_oscillator&oldid=698325865, Jan. 5, 2016, 9 pgs.

"Squid", Wikipedia, https://en.wikipedia.org/w/index.php?title=SQUID&oldid=707679432, Mar. 1, 2016, 5 pgs.

Roy , et al., "Broadband parametric amplification with impedance engineering: Beyond the gain-bandwidth product", arXiv:1510. 03065v2 [cond-mat.mes-hall], Feb. 2, 2016, 15 pgs.

EPO, Summons to attend oral proceedings dated Oct. 18, 2019, in EP 17153888.7, 6 pgs.

EPO, Relevance of third-party observation dated Apr. 22, 2020 in EP 17153888.7, 1 pg.

EPO, Communication pursuant to Rule 114(2) EPC (third party observations) dated May 8, 2020, in EP 17153888.7, 13 pgs.

Casson , et al., "A Review and Modern Approach to LC Ladder Synthesis", J. Low Power Electron. App., Jan. 28, 2011, 25 pgs.

EPO, File history of EP 17153888.7 downloaded Apr. 15, 2020, 1185 pgs.

T.C. White, et al., Traveling wave parametric amplifier with Josephson junctions using minimal resonator phase matching., Applied Physics Letters 106, 242601 Jun. 15, 2015. https://doi.org/10.1063/1.4922348.†

T.C. White, Traveling wave parametric amplifier with Josephson junctions using minimal resonator phase matching, Published Jun. 15, 2015, Published by the American Institute of Physics.†

\* cited by examiner
† cited by third party

US 10,740,688 B2

IMPEDANCE-MATCHED MICROWAVE QUANTUM CIRCUIT SYSTEMS

CROSS-REFERENCE TO RELATED APPLICATIONS

This application claim priority to U.S. Provisional Application No. 62/306,983, filed Mar. 11, 2016 and entitled "Integrated Matching Networks for Integrated Quantum Circuits," which is hereby incorporated by reference.

BACKGROUND

The following description relates to impedance-matched microwave quantum circuit systems.

Microwave quantum circuit systems can be used for quantum information processing applications. Microwave quantum circuit systems can include quantum microwave circuit devices. Some example quantum microwave circuit devices include Josephson junctions, capacitors, inductors, and transmission lines.

DETAILED DESCRIPTION

In some aspects of what is described here, a microwave quantum circuit system includes a quantum circuit device coupled to an impedance matching circuit device on a substrate. Quantum circuit devices can be used, for instance, to implement quantum bits (qubits), quantum-limited amplifiers or other types of devices. Impedance matching circuit devices can be used to improve the performance of microwave circuits, such as those that include quantum circuit devices. In some implementations, an impedance matching circuit device is integrated on the same substrate (e.g., on the same circuit die, or "on-chip") as a quantum circuit device to allow for increased performance of the quantum circuit device. For example, in some instances, the quantum circuit device is a parametric amplifier, and the bandwidth of the parametric amplifier is increased by coupling an impedance matching circuit device to the parametric amplifier. In addition, by coupling the impedance matching circuit device to the parametric amplifier on the same substrate, the quantum circuit device may be efficiently coupled to other circuitry.

Figure 1:
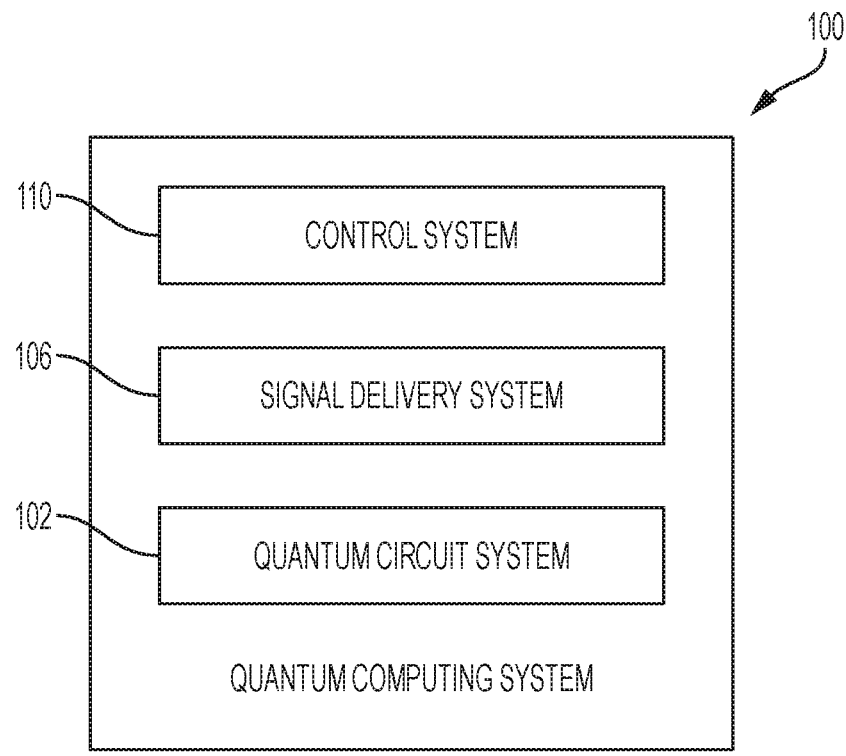
FIG. 1 is a block diagram of an example quantum computing system.

FIG. 1 is a block diagram of an example quantum computing system 100. The example quantum computing system 100 shown in FIG. 1 includes a control system 110, a signal delivery system 106, and a quantum circuit system 102. A quantum computing system may include additional or different features, and the components of a quantum computing system may operate as described with respect to FIG. 1 or in another manner.

The example quantum computing system 100 shown in FIG. 1 can perform quantum computational tasks by executing quantum algorithms. In some implementations, the quantum computing system 100 can perform quantum computation by storing and manipulating information within individual quantum states of a composite quantum system. For example, quantum bits or "qubits" can be stored in and represented by an effective two-level sub-manifold of a quantum coherent physical system. Quantum circuit devices can be used to perform quantum logic operations on single qubits or conditional quantum logic operations on multiple qubits. In some instances, the conditional quantum logic can be performed in a manner that allows large-scale entanglement within the quantum computing device. Control signals can manipulate the quantum states of individual qubits and the joint states of multiple qubits. In some instances, information can be read out from the composite quantum system by measuring the quantum states of the qubit devices.

The example quantum circuit system 102 shown in FIG. 1 is a superconducting quantum integrated circuit that includes qubit devices. The qubit devices are used to store and process quantum information, for example, by operating as ancilla qubits, data qubits or other types of qubits in a quantum algorithm. In some instances, all or part of the quantum circuit system 102 functions as a quantum processor, a quantum memory, or another type of subsystem. In some implementations, the quantum circuit system 102 is a microwave quantum circuit system that includes microwave circuit components (e.g., conductors arranged in a co-planar or microstrip topology). For example, in some instances, the quantum circuit system 102 may be similar to the microwave quantum circuit system 200 of FIG. 2. In some instances, the quantum circuit system 102 includes an impedance matching circuit device (e.g., including transmission lines, inductors, or capacitors) coupled to a quantum circuit device (e.g., a qubit or parametric amplifier) on the same substrate. For instance, the quantum circuit system 102 may include circuit elements arranged according to the examples shown in FIGS. 8A, 8B and 9. The quantum circuit system 102 may include circuit elements arranged in another manner.

In some implementations, the quantum circuit system 102 includes a two-dimensional or three-dimensional device array, which includes devices arranged in a lattice structure. For instance, a two-dimensional device array can be formed on a two-dimensional wafer surface, where the devices (e.g., qubit devices) are arranged in a two-dimensional lattice structure and configured to communicate with one another. A three-dimensional device array can be formed by a stack of two-dimensional wafers, where the devices are arranged in a three-dimensional lattice structure and configured (e.g., by connections between wafers) to communicate with one another. In some implementations, an electromagnetic waveguide system provides an environment for the device array. For instance, some or all of the quantum circuit system 102 can be housed in an electromagnetic waveguide system that provides a low-noise electromagnetic environment for the qubit devices.

The example quantum circuit system 102, and in some cases all or part of the signal delivery system 106, can be maintained in a controlled cryogenic environment. The environment can be provided, for example, by shielding equipment, cryogenic equipment, and other types of environmental control systems. In some examples, the components in the quantum circuit system 102 operate in a cryogenic temperature regime and are subject to very low electromagnetic and thermal noise. For example, magnetic shielding can be used to shield the system components from stray magnetic fields, optical shielding can be used to shield the system components from optical noise, thermal shielding and cryogenic equipment can be used to maintain the system components at controlled temperature, etc.

The example quantum circuit system 102 may include qubit devices that each store a single qubit (a bit of quantum information), and the qubits can collectively define the computational state of a quantum processor or quantum memory. In some implementations, qubit devices in the quantum circuit system 102 can each be encoded with a single bit of quantum information. For instance, each of the qubit devices can define two states that are used as computational basis states ("0" and "1"), and each qubit device can transition between its computational basis states or exist in an arbitrary superposition of its basis states.

The example quantum circuit system 102 may also include readout devices that selectively interact with the qubit devices to detect their quantum states. For example, the readout devices may provide readout response signals that indicate the computational state of the quantum processor or quantum memory. The quantum circuit system 102 may also include other quantum circuit devices that selectively operate on individual qubits or pairs of qubits. For example, quantum circuit devices may produce entanglement or other multi-qubit states over two or more qubits in the quantum circuit system 102.

In the example shown in FIG. 1, the signal delivery system 106 provides communication between the control system 110 and the quantum circuit system 102. For example, the signal delivery system 106 can receive control signals from the control system 110 and deliver the signals to the quantum circuit system 102. In some instances, the signal delivery system 106 performs preprocessing, signal conditioning, or other operations to the control signals before delivering them to the quantum circuit system 102.

In some implementations, the signal delivery system 106 includes connectors or other hardware elements that transfer signals between the quantum circuit system 102 and the control system 110. For example, the connection hardware can include signal lines, signal processing hardware, filters, feedthrough devices (e.g., light-tight feedthroughs, etc.), and other types of components. In some implementations, the connection hardware can span multiple different temperature and noise regimes. For example, the connection hardware can include a series of temperature stages (60 K, 3 K, 800 mK, 150 mK) that decrease between a higher temperature regime (e.g., at the control system 110) and a lower temperature regime (e.g., at the quantum circuit system 102).

In the example quantum computing system 100 shown in FIG. 1, the control system 110 controls operation of the quantum circuit system 102. The example control system 110 may include data processors, signal generators, interface components and other types of systems or subsystems. In some cases, the control system 110 includes one or more classical computers or classical computing components. Components of the example control system 110 may operate in a room temperature regime, an intermediate temperature regime, or both. For example, the control system 110 can be configured to operate at much higher temperatures and be subject to much higher levels of noise than are present in the environment of the quantum circuit system 102.

In some implementations, the control system 110 includes a classical computing system that executes software to generate instructions for the quantum circuit system 102. For example, the control system 110 may decompose a quantum logic circuit into discrete control operations or sets of control operations that can be executed by the hardware in the quantum circuit system 102. In some examples, that control system 110 applies a quantum logic circuit by generating signals that cause qubit devices and other devices in the quantum circuit system 102 to execute operations. For instance, the operations may correspond to single-qubit gates, two-qubit gates, qubit measurements, etc. The control system 110 can generate control signals that are communicated to the quantum circuit system 102 by the signal delivery system 106, and the devices in the quantum circuit system 102 execute the operations in response to the control signals.

In some aspects of operation, information is encoded in data qubits residing in the quantum circuit system 102. For example, a single qubit of information may be written to, stored on or otherwise encoded in each data qubit. In some cases, to encode information in the data qubits, the control system 110 sends control signals to the quantum circuit system 102. The control signals can each be addressed to individual qubit devices, and can be configured to modify the quantum states of the respective qubits to which they are addressed. For example, the control signals may be configured to transit the qubit devices to a particular computational state, to apply logical operations to the qubits, or to otherwise encode information in the qubit devices.

In some aspects of operation, the control system 110 includes a microwave signal source (e.g., an arbitrary waveform generator), a bias signal source (e.g., a direct current source) and other components that provide control signals to the signal delivery system 106. The control signals can include analog signals that are generated based on digital control information provided, for instance, by a classical processor in the control system 110. In some instances, the control signals are generated by the control system 110 at high temperature (e.g., above cryogenic temperatures) and delivered to the quantum circuit system 102 operating at low temperature (e.g., at cryogenic temperatures). Within the quantum circuit system 102, the control signals can be delivered to individual circuit devices, for instance, to apply quantum logic gates, readout qubit states or to perform other operations.

In some aspects of operation, the quantum circuit system 102 produces signals that are delivered to the control system 110 by the signal delivery system 106. For example, readout response signals (e.g., in response to a readout interrogation signal) may be transferred to the signal delivery system 106. The readout response signals can include analog signals that are produced at low temperature and delivered to the control system 110 operating at a higher temperature. The control system 110 may include conversion hardware that digitizes the readout response signals to be processed, for example, by a classical processor in the control system 110.

Figure 2:
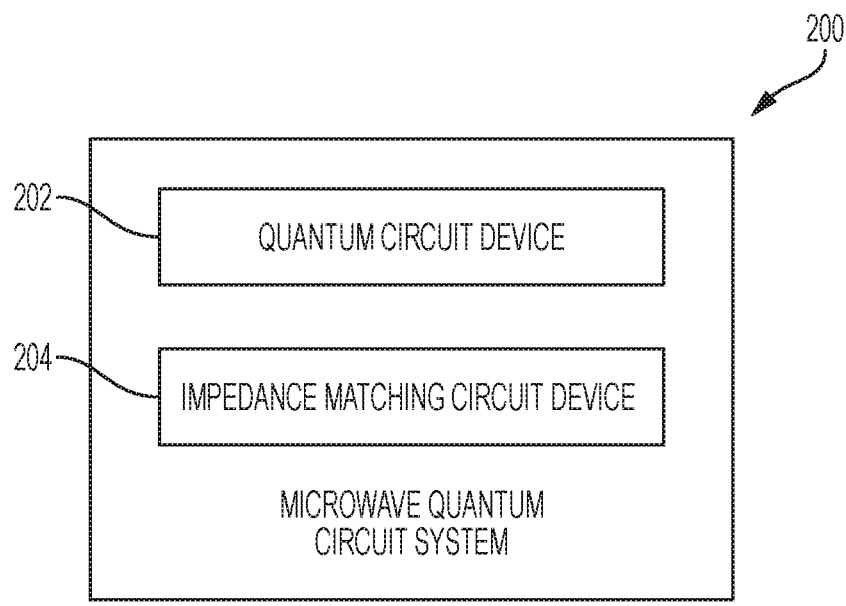
FIG. 2 is a block diagram of an example microwave quantum circuit system.

FIG. 2 is a block diagram of an example microwave quantum circuit system 200. The example microwave quantum circuit system 200 includes a quantum circuit device 202 and an impedance matching circuit device 204, which are formed on the same substrate. In some cases, the quantum circuit device 202 and the impedance matching circuit device 204 are included in the same circuit die. The example quantum circuit device 202 shown in FIG. 2 includes one or more circuit elements that operate based on quantum phenomena (e.g., the Josephson effect), and may be used in quantum information processing systems such as the quantum computing system 100 of FIG. 1. The quantum circuit device 202 can be or include, for instance, a qubit device or a Josephson parametric amplifier (JPA) that includes one or more Josephson junctions. The quantum circuit device 202 may include other devices or circuit elements as well, some of which may operate based on classical phenomena. The example impedance matching circuit device 204 includes one or more circuit elements that operate to define an impedance between an input of the microwave quantum circuit system 200 and the quantum circuit device 202.

In the example shown, the impedance matching circuit device 204 is coupled to the quantum circuit device 202. For example, the impedance matching circuit device 204 can be communicably coupled with the quantum circuit device 202, such that impedance matching circuit device 204 and the quantum circuit device 202 can exchange electromagnetic signals (e.g., microwave signals). The impedance matching circuit device 204 may be directly connected to the quantum circuit device 202, or they may be indirectly connected by an intermediate device or circuit element. The example impedance matching circuit device 204 is designed to increase the performance of the quantum circuit device 202. For example, in some implementations, the quantum circuit device 202 is a parametric amplifier, and the impedance matching circuit device 204 is designed to increase the amplification bandwidth of the parametric amplifier. In some instances, the example microwave quantum circuit system 200 is designed to operate at or near cryogenic temperatures.

Figure 3:
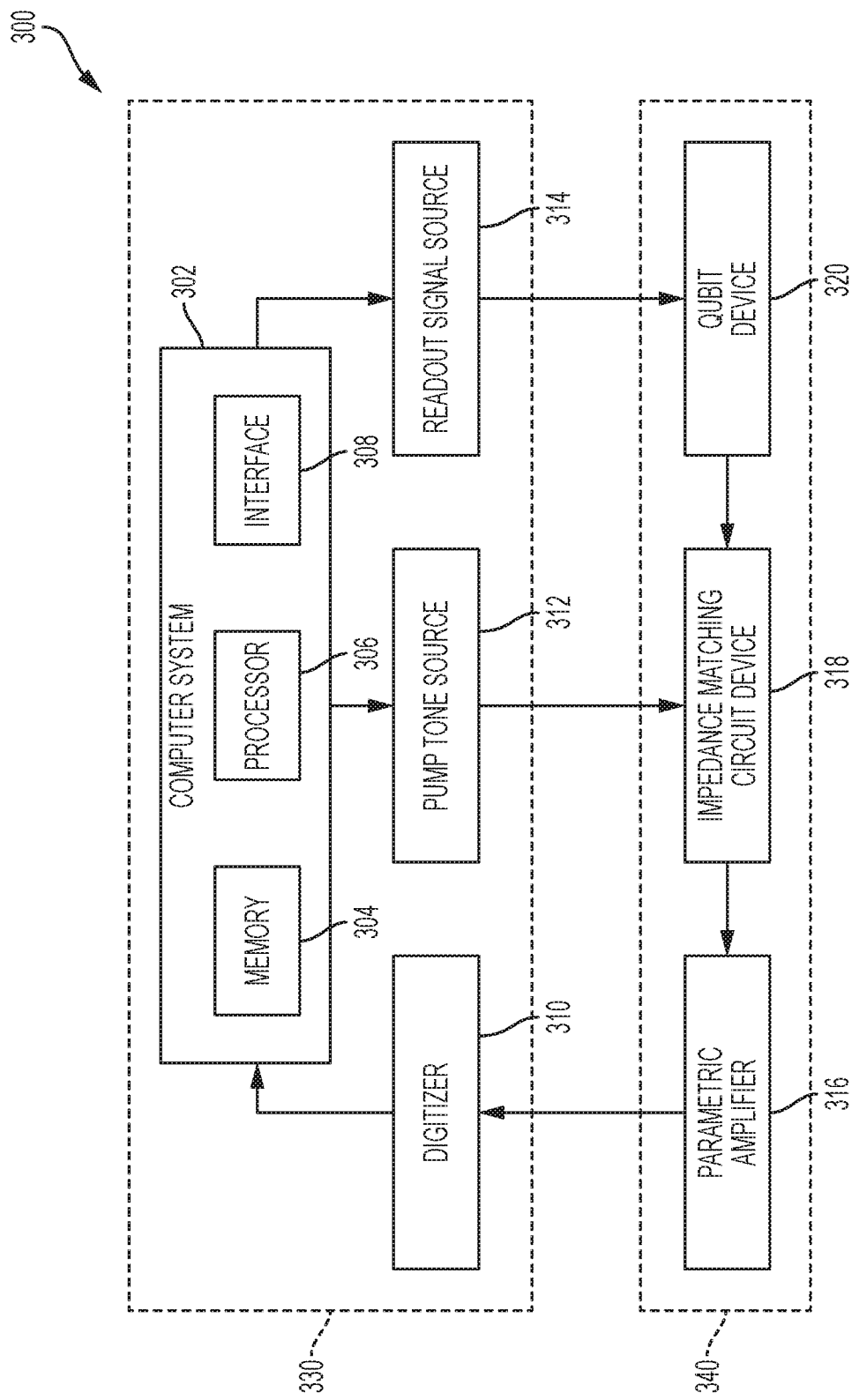
FIG. 3 is a block diagram of another example quantum computing system.

FIG. 3 is a block diagram of another example quantum computing system 300. The example quantum computing system 300 includes a control system 330 and a quantum circuit system 340. The example control system 330 includes a computer system 302, a digitizer 310, pump tone source 312, and a readout signal source 314. The example quantum circuit system 340 includes a parametric amplifier 316, an impedance matching circuit device 318, and a qubit device 320. In some implementations, the control system 330 and quantum circuit system 340 are coupled to one another by a signal delivery system (e.g., similar to signal delivery system 106 of FIG. 1). In some implementations, the control system 330 resides in a room temperature environment while the quantum circuit system 340 resides in a cryogenic temperature environment.

In the example shown in FIG. 3, the computer system 302 controls the pump tone source 312 and readout signal source 314 to generate pump tones and readout signals, respectively, that are sent to the quantum circuit system 340. In particular, the computer system 302 causes the readout signal source 314 to generate a readout interrogation signal that is sent to the qubit device 320 in the quantum circuit system 340. In some implementations, the readout interrogation signal is a microwave frequency pulse produced by a microwave source at a frequency that is near or at a resonance frequency of the qubit device 320. In response to the readout interrogation, the qubit device 320 generates a readout response signal that indicates a state of the qubit. In some instances, the readout response signal is a reflected signal from the qubit device 320 in response to the readout interrogation signal. The readout response signal is communicated through the impedance matching circuit device 318 to the parametric amplifier 316 for amplification.

The computer system 302 also causes the pump tone source 312 to generate a pump tone that is transmitted to the parametric amplifier 316 (via the impedance matching circuit device 318) in the quantum circuit system 340. In some implementations, the pump tone is a microwave signal having a frequency that is approximately equal to the resonant frequency of the parametric amplifier 316. The parametric amplifier uses the pump tone received from the pump tone source 312 to amplify the qubit state signal from the qubit device 320. The amplified qubit state signal is sent from the parametric amplifier 316 to the digitizer 310 of the control system 330 in an analog format, and the digitizer 310 converts the information into a digital format that may be read and analyzed by the computer system 302.

The example qubit device 320 defines quantum energy levels that can be used to encode a qubit (a quantum bit) of information. The qubit can be utilized, for example, as an ancilla qubit or data qubit in a quantum logic circuit or quantum algorithm. In some implementations, the qubit device 320 is implemented as a charged-based qubit device, such as, for example a transmon device. In some implementations, the qubit device 320 is implemented by a flux-based qubit device, such as, for example, a fluxonium device. The qubit device 320 may be implemented by other types of devices.

In some implementations, the qubit device 320 has a fixed qubit operating frequency that is defined by an electronic circuit of the qubit device 320. For instance, the qubit device 320 may include a transmon qubit and may be implemented without a superconducting quantum interference device (SQUID) loop. In some examples, the qubit operating frequency of the qubit device 320 is tunable, for example, by application of an offset field. For instance, the qubit device 320 may include a fluxonium qubit and may include a SQUID loop that is tunable by application of magnetic flux.

A transmon device is an example of a structure that can be used as a charge-based qubit device. In some cases, a transmon device can be fabricated on a dielectric substrate (e.g., formed from sapphire, silicon, etc.) that supports a superconducting thin film (e.g., formed from aluminum, niobium, etc.). For instance, the transmon device may be fabricated by double-angle evaporation of thin-film aluminum onto a sapphire or silicon substrate, or by another fabrication process. An example transmon device includes a Josephson junction and a shunt capacitance, where the shunt capacitance is formed in a topologically closed manner to reduce far-field coupling and spurious couplings to other devices. A transmon device can be coupled to another device or an electrode, for example, by a differential capacitance formed between the other device and inner and outer electrodes of the Josephson junction.

A fluxonium device is an example of a structure that can be used as a flux-based qubit device. In some cases, a fluxonium device can be fabricated on a dielectric substrate (e.g., formed from sapphire, silicon, etc.) that supports a superconducting thin film (e.g., formed from aluminum, niobium, etc.). For instance, the fluxonium device may be fabricated by double-angle evaporation of thin-film aluminum onto a sapphire or silicon substrate, or by another fabrication process. An example fluxonium device includes a Josephson junction, a shunt inductance and a shunt capacitance connected in parallel and forming a loop. A magnetic flux signal can be applied to the loop, for example, by applying a DC signal to bias circuitry that has a mutual inductance with the loop. An input capacitance across the Josephson junction can act as a charge-coupling control port, which may be formed of a topologically closed capacitance, for instance, where an inner island is encircled by an outer island. In some implementations, a control or coupling port can be realized by coupling the device with a differential capacitance with respect to the two islands to a nearby electrode.

In some implementations, the parametric amplifier 316, the impedance matching circuit device 318, and the qubit device 320 are each implemented as microwave circuit components, and are coupled to each other by couplers, circulators, transmission lines, or other microwave circuit elements. In some instances, the quantum circuit system 340 is implemented similar to quantum circuit system 400 of FIG. 4. In some instances, the impedance matching circuit device 318 is implemented as one of the example impedance matching circuit devices described below (e.g., the impedance matching circuit device 700 of FIG. 7 or the impedance matching circuit devices 812A, 812B of FIGS. 8A-8B), and the parametric amplifier 316 is implemented as one of the example JPAs described below (e.g., the JPAs 808A, 808B of FIGS. 8A-8B). The parametric amplifier 316 and impedance matching circuit device 318 may be implemented in another manner.

The example computer system 302 includes a memory 304, a processor 306, and an interface 308. The computer system 302 can be a classical computer that stores and processes information as classical bits, for instance, using classical computer hardware. The memory 304 can include, for example, random access memory (RAM), a storage device (e.g., a writable read-only memory (ROM) or others), a hard disk, or another type of storage medium. The example memory 304 stores instructions (e.g., computer code, a computer program, etc.) associated with an operating system, computer applications and other resources. The memory 304 can also store application data and data objects that can be interpreted by one or more applications or virtual machines running on the computer system 302. The computer system 302 can be preprogrammed, or it can be programmed (and reprogrammed), by loading a program from another source (e.g., from a DVD-ROM, from a removable memory device, from a remote server, from a data network or in another manner). In some cases, the memory 304 stores computer-readable instructions for software applications, scripts, programs, functions, executables or other modules that are interpreted or executed by the processor 306.

In the example computer system 302, the processor 306 can execute instructions, for example, to generate output data based on data inputs. For example, the processor 306 can run computer programs by executing or interpreting the software, scripts, programs, functions, executables, or other modules stored in the memory 304. The example processor 306 can include one or more chips or chipsets that include analog circuitry, digital circuitry, or a combination thereof. In some cases, the processor 306 includes multiple processor devices such as, for example, one or more main processors and one or more co-processors. For instance, the processor 306 may include a main processor that can delegate certain computational tasks to a co-processor, which may be configured to perform the computational tasks more efficiently than the main processor or in parallel with other computational tasks performed by other processor devices. In some instances, the processor 306 coordinates or controls operation of other components of the computer system 302, such as, for example, user interfaces, communication interfaces, peripheral devices and possibly other components.

In the example computer system 302, the interface 308 provides communication with other devices. In some cases, the interface 308 includes a wireless communication interface that provides wireless communication under various wireless protocols or standards. For instance, the interface 308 may communicate using Bluetooth, Wi-Fi, Near Field Communication (NFC), SMS, EMS, or MMS messaging, GSM, CDMA, TDMA, PDC, WCDMA, CDMA2000, or GPRS. Such communication may occur, for example, through a radio-frequency transceiver or another type of component. In some cases, the interface 308 includes a wired communication interface (e.g., USB, Ethernet) that can be connected to one or more input/output devices, such as, for example, a keyboard, a pointing device, a scanner, or a networking device such as a switch or router, for example, through a network adapter.

Figure 4:
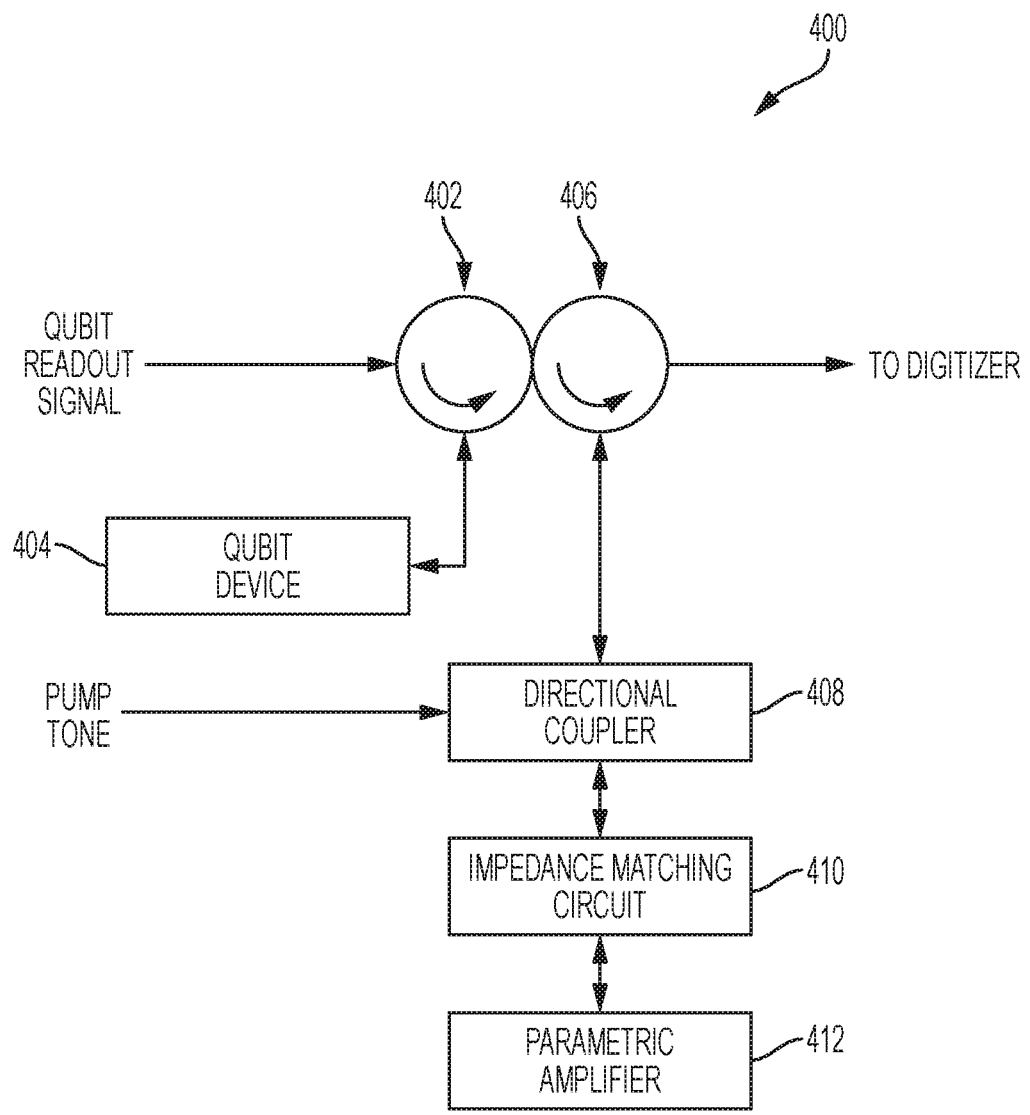
FIG. 4 is a diagram of an example quantum circuit system.

FIG. 4 is a diagram of an example quantum circuit system 400. The example quantum circuit system 400 includes a first circulator 402, a qubit device 404, a second circulator 406, a directional coupler 408, an impedance matching circuit 410, and a parametric amplifier 412. Each of the components of the example quantum circuit system 400 shown in FIG. 4 are implemented as microwave circuit components. The qubit device 404 and the parametric amplifier 412 are examples of quantum circuit devices that can include one or more Josephson junctions (e.g., in a SQUID loop or another arrangement). In some implementations, the components of the quantum circuit system 400 include superconducting films (e.g., aluminum or niobium) on a substrate in a coplanar waveguide topology (e.g., similar to the quantum circuit system 800A shown in FIG. 8A) or in a microstrip topology (e.g., similar to the quantum circuit system 800B shown in FIG. 8B).

In some aspects of operation of the example quantum circuit system 400, a qubit readout signal (e.g., a readout interrogation signal) is communicated through the first circulator 402, which directs the qubit readout signal to the qubit device 404. The qubit device 404 may be implemented as a charged-based qubit device (e.g., a transmon device), a flux-based qubit device (e.g., a fluxonium device) or another type of device. The qubit device 404 receives the qubit readout signal, and generates a qubit state signal (e.g., a readout response signal) that indicates a state of the qubit device 404. In some instances, the qubit state signal may be a signal reflected by the qubit device 404 in response to the qubit readout signal. The qubit state signal can be produced by reflecting the qubit readout signal with additional information, and the properties of the qubit state signal may indicate a quantum state of the qubit device 404. The additional information can be, for example, a frequency shift, a phase shift, an amplitude shift, or a combination of these and other modifications, that indicates the state of the qubit device 404.

The qubit state signal is communicated through the second circulator 406, which directs the qubit state signal to the directional coupler 408. The example directional coupler 408 receives a pump tone, and communicates the pump tone to the impedance matching circuit 410 and the parametric amplifier 412. The directional coupler 408 attenuates the pump tone signal in the direction toward the second circulator 406 (e.g., by approximately −20 dB). The example directional coupler 408 also communicates the qubit state signal to the impedance matching circuit 410 and the parametric amplifier 412. The example impedance matching circuit 410 provides impedance matching between the circuit elements of the quantum circuit system 400 and the input line for the qubit readout signal. In some implementations, the impedance matching circuit 410 is implemented as a ladder network of inductors and shunt capacitors. The inductors and shunt capacitors may be implemented, for example, using meandered conductive traces (as inductors) and conductive traces forming interdigitated gaps between the meandered conductive traces (as shunt capacitors), as the impedance matching circuit device 700 of FIG. 7 or otherwise.

The example impedance matching circuit 410 passes the qubit state signal to the parametric amplifier 412, and the example parametric amplifier 412 amplifies the qubit state signal using the pump tone passed by the directional coupler 408. In some implementations, the parametric amplifier 412 is implemented as a JPA that includes a SQUID loop and a direct current (DC) bias loop, similar to the example JPAs 808A, 808B shown in FIGS. 8A-8B. The amplified qubit state signal is reflected back through the impedance matching circuit 410, the directional coupler 408, and the second circulator 406, and is directed toward a digitizer, where the amplified qubit state signal is converted from an analog format to a digital format that may be analyzed by a computer system, such as the computer system 302 of FIG. 3 described above.

Figure 5:
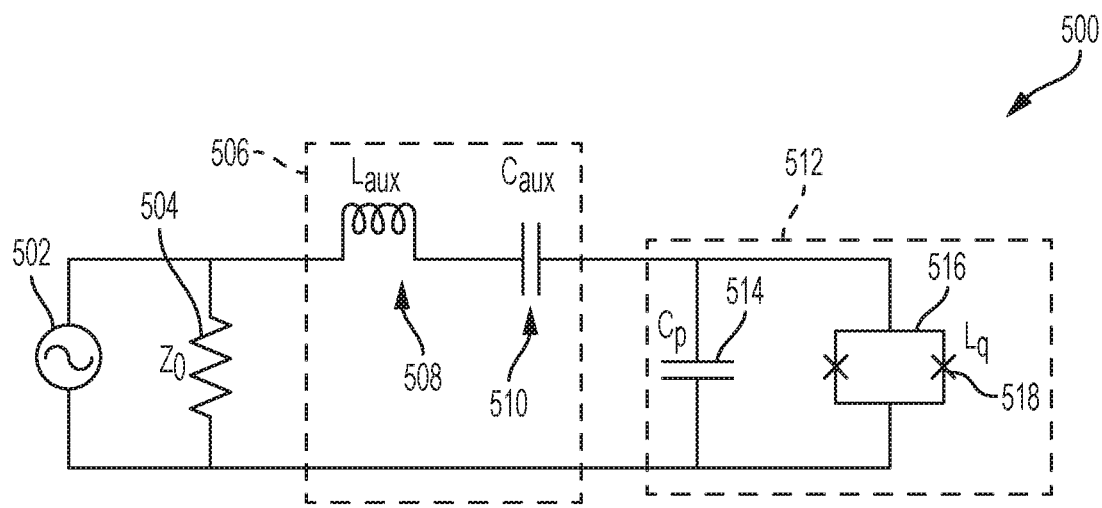
FIG. 5 is a circuit model of an example microwave quantum circuit system.

FIG. 5 is a circuit model of an example microwave quantum circuit system 500. The example microwave quantum circuit system 500 includes a quantum circuit 512, which includes a SQUID 516 in parallel with a capacitor 514. The example SQUID 516 includes Josephson junctions 518 in parallel. In some implementations, the quantum circuit 512 acts as a parametric amplifier that amplifies signals. The example microwave quantum circuit system 500 also includes an impedance matching circuit 506 coupled to the quantum circuit 512. The impedance matching circuit 506 includes an inductor 508 and capacitor 510 in series. The example impedance matching circuit 506 defines an impedance of the quantum circuit 512 as seen by another circuit element (e.g., a qubit device), external device (e.g., a microwave source) or a combination. In the example shown, the impedance matching circuit 506 acts as an impedance matching network to broaden the bandwidth of the quantum circuit 512. For example, where the quantum circuit 512 is a parametric amplifier, the impedance matching circuit 506 allows for a higher amplification bandwidth for the parametric amplifier. The impedance matching circuit 506 shown in FIG. 5 is an example of a linear impedance matching circuit.

In the example shown, the resistor 504 represents an impedance of a transmission line connecting a microwave signal source 502 (e.g., a quantum information processing device) to the impedance matching circuit 506 and quantum circuit 512. The example impedance matching circuit 506 acts as a resonator, and can therefore be designed to resonate at a certain frequency. Accordingly, in some instances, the input impedance of the quantum circuit 512 may be used in determining properties of the impedance matching circuit 506, such as desired values of the inductor 508 and capacitor 510 used in the impedance matching circuit 506. In some implementations, the resonator structure of the impedance matching circuit 506 is created using a half-wavelength transmission line. In some cases, the half-wavelength transmission line can be implemented as an artificial transmission line that is on the same substrate as the quantum circuit 512. For example, the artificial transmission line can be designed as a lumped network of alternating series inductors and shunt capacitors as described below with respect to the circuit model of FIG. 6. In some instances, the artificial transmission line can be designed similar to the impedance matching circuit device 700 of FIG. 7.

Figure 6:
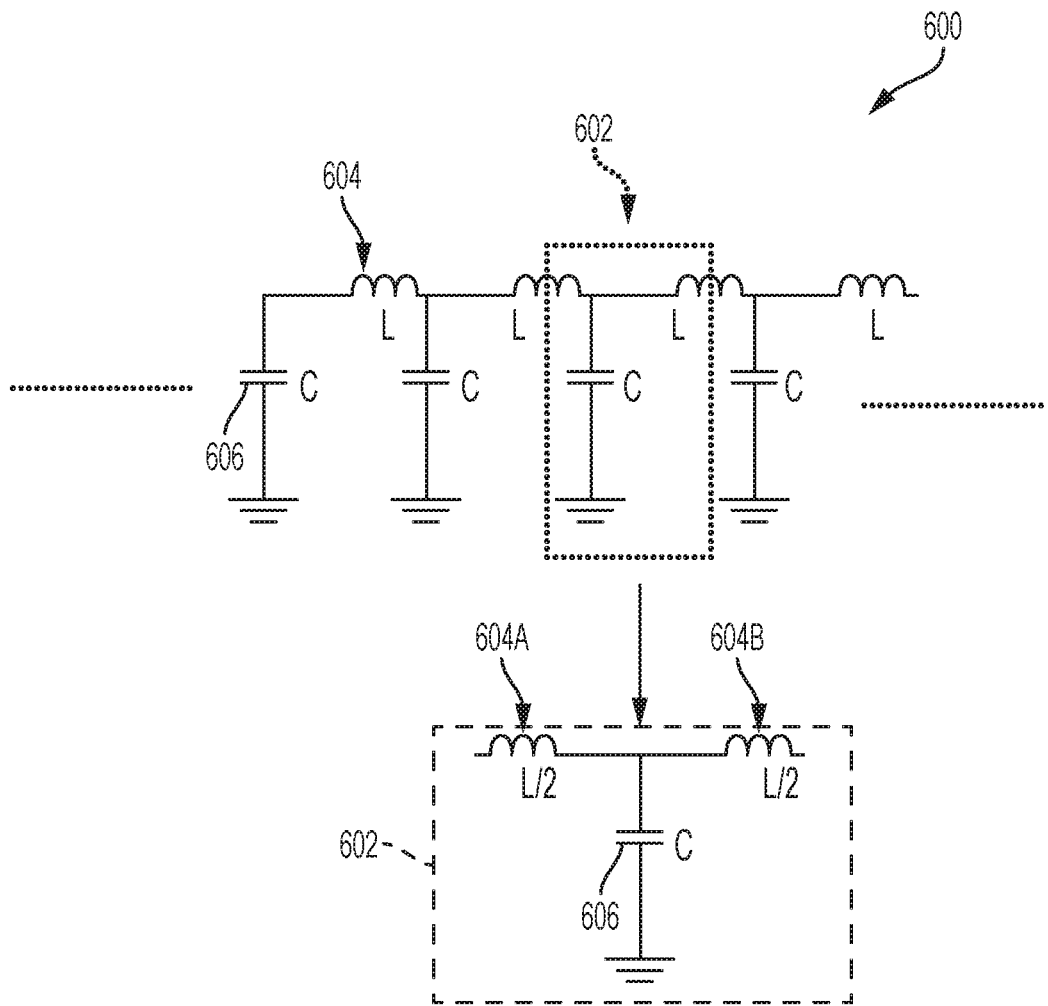
FIG. 6 is a circuit model of an example impedance matching network.

FIG. 6 is a circuit model of an example impedance matching network 600. In some instances, the circuit model represents an impedance matching circuit device on the same substrate as a quantum circuit device (e.g., a qubit device or a parametric amplifier). The example circuit model shown in FIG. 6 is an example of a ladder network of inductors and shunt capacitors. In some cases, the circuit model shown in FIG. 6 can be used to impedance match between a quantum circuit device and an input line. For example, the circuit model shown in FIG. 6 can be used to form an artificial transmission line that includes a lumped network of alternating series inductors and shunt capacitors, which may impedance match between a JPA and an input line in a microwave quantum circuit system. The impedance matching network 600 shown in FIG. 6 is an example of a linear impedance matching network.

In the example shown in FIG. 6, the artificial transmission line structure is a periodic structure with unit cells 602 repeated in series. As shown in the lower half of FIG. 6, each unit cell 602 in this example circuit model is a series inductor that includes inductor portions 604A, 604B and a shunt capacitor 606. To determine the values of the inductors 604 and shunt capacitors 606, the unit cell 602 can be described by an ABCD matrix according to the following equation:

$$\begin{bmatrix} A & B \\ C & D \end{bmatrix}_{cell} = \begin{bmatrix} 1 & j\omega L/2 \\ 0 & 1 \end{bmatrix} \begin{bmatrix} 1 & 0 \\ j\omega C & 1 \end{bmatrix} \begin{bmatrix} 1 & j\omega L/2 \\ 0 & 1 \end{bmatrix}$$

A propagation constant $\beta$ of the artificial transmission line (the ratio of the amplitude of the microwave at the source to the amplitude at some distance d) and a characteristic impedance $Z_B$ of the artificial transmission line can be described and determined by the following equations:

$$\cos\beta d = A,$$

$$Z_B = \frac{B}{\sqrt{A^2 - 1}}.$$

By solving these equations, values of the series inductors 604 and shunt capacitors 606 in the example circuit model may be determined. In addition, by solving these equations, a number of unit cells to construct the artificial transmission line (e.g., to ensure it resonates) may be determined.

Figure 7:
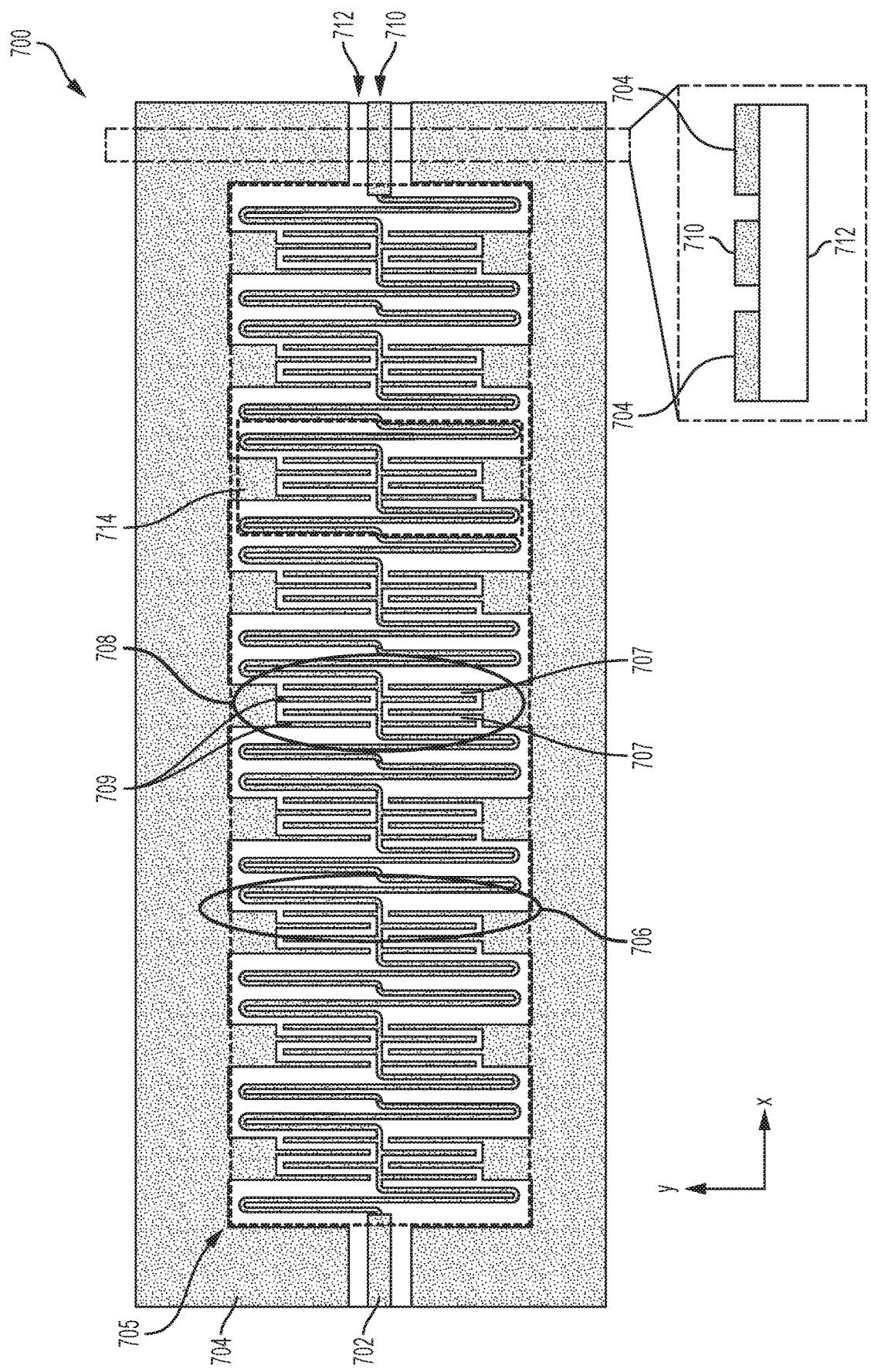
FIG. 7 is a diagram of an example layout of an impedance matching circuit device.

FIG. 7 is an example layout of an impedance matching circuit device 700. The example impedance matching circuit device 700 is an example implementation of the circuit model shown in FIG. 6, with series inductors and shunt capacitors creating an artificial transmission line structure. The example impedance matching circuit device 700 is implemented as a coplanar waveguide topology in the layout shown in FIG. 7. However, the example impedance matching circuit device 700 may be implemented as a microstrip topology as well. The example impedance matching circuit device 700 includes an input line 702, a ground conductor 704, a ladder network of inductors 706 and shunt capacitors 708, an output line 710, and a dielectric substrate 712.

In the example impedance matching circuit device 700, the input line 702, the ground conductor 704, the inductors 706, the shunt capacitors 708, and output line 710 are formed in one or more conductive layers that are supported on the dielectric substrate 712. The conducting material on the dielectric substrate 712 can include superconducting material, such as, for example, aluminum, niobium, metal alloys or a combination of these and other types of materials. The example dielectric substrate 712 can be sapphire, silicon, or another dielectric material. In the example shown, the inductors 706 are implemented as meandered conductive traces, and the shunt capacitors 708 are implemented as conductors that form interdigitated gaps 707 between the meandered conductive traces.

The example layout shown in FIG. 7 has a series of nine unit cells 714, with each unit cell 714 including an inductor 706 and a shunt capacitor 708. The size and shape of the meandered conductive traces and interdigitated gaps 707 can be designed, and in some cases optimized, so that the physical geometry implements a specified inductance and capacitance. The design or optimization process can be performed, for example, parametrically, such as by running an optimization algorithm. As shown in FIG. 7, a boundary of the example ground conductor 704 defines an interior clearance area 705, and the inductors 706 and shunt capacitors 708 are formed within the interior clearance area 705. In some instances, the interior clearance area 705 is approximately 1660 μm in the x-direction and approximately 490 μm in the y-direction. The example shunt capacitors 708 include conductive traces 709 extending in a first direction (the y-direction in FIG. 7) from the boundary of the interior clearance area defined by the ground conductor, and the elongate conductive traces are spaced apart from each other in a second direction (the x-direction in FIG. 7) perpendicular to the first direction. The longest spatial dimension of the meandered conductive traces is parallel to the longest spatial dimension of the elongate conductive traces. For instance, in the example shown in FIG. 7, the longest spatial dimension of the meandered conductive traces and longest spatial dimension of the elongate conductive traces are oriented in the y-direction.

Figure 8A:
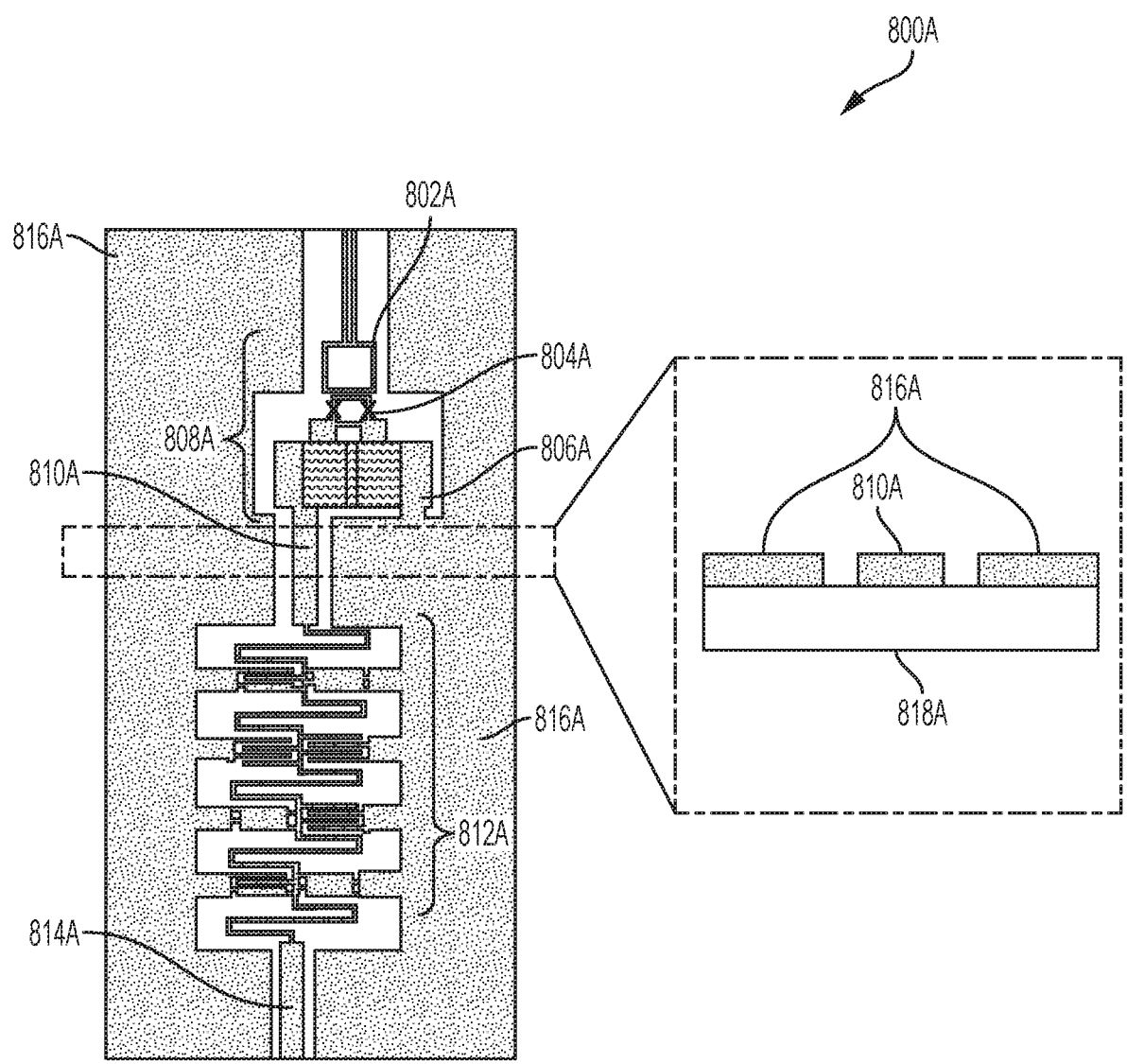
FIGS. 8A-8B are diagrams of example layouts of quantum circuit systems.
Figure 8B:
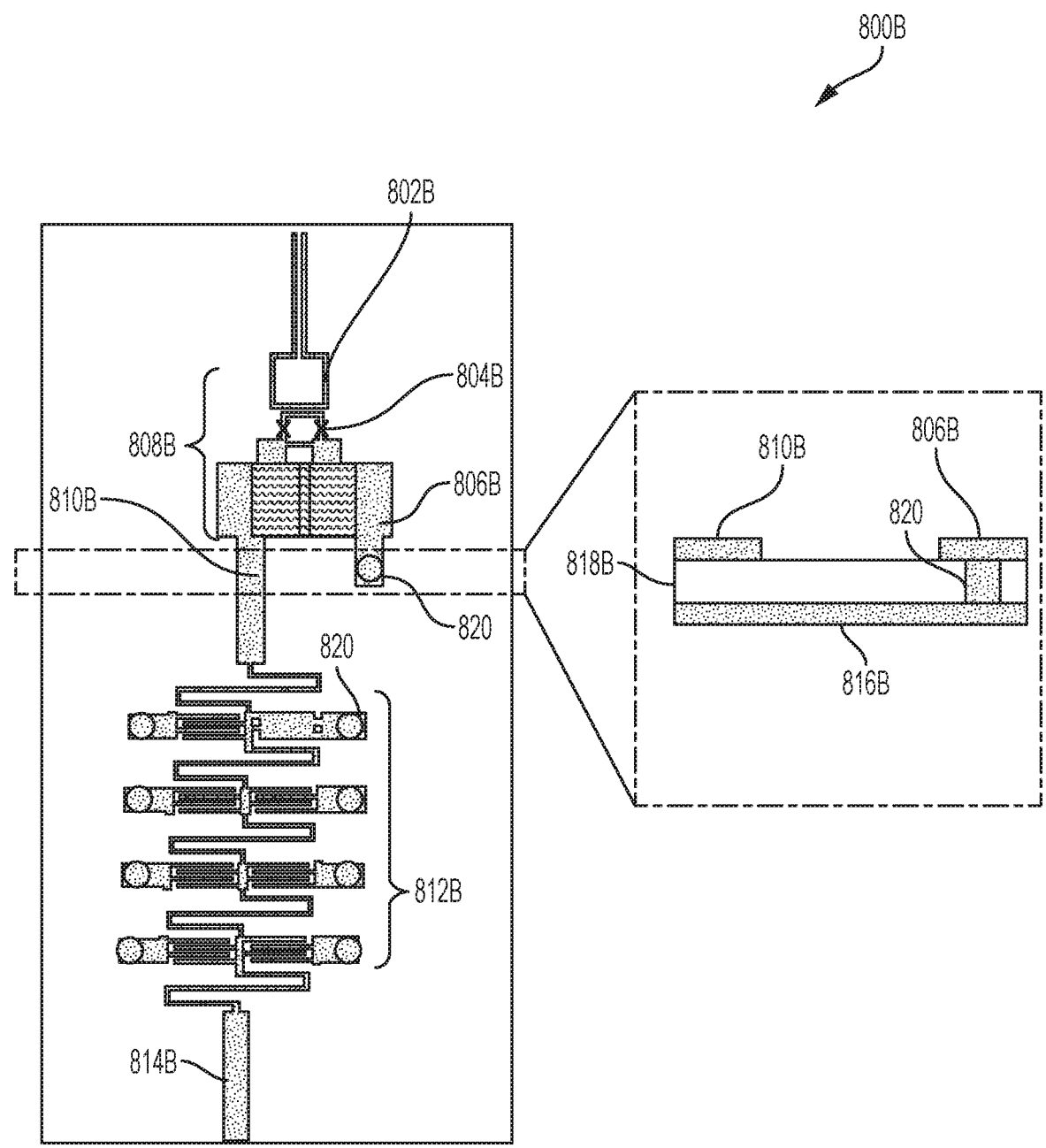

FIGS. 8A-8B are diagrams showing example layouts of quantum circuit systems 800A, 800B. The quantum circuit systems 800A, 800B each include a Josephson parametric amplifier (JPA) and an impedance matching circuit device that reside on the same substrate and are communicably coupled to each other. The example quantum circuit system 800A of FIG. 8A is implemented in a coplanar waveguide topology (e.g., with the ground conductor 816A being on the same side of the dielectric substrate 818A as the circuit elements), while the example quantum circuit system 800B of FIG. 8B is implemented in a microstrip topology (e.g., with the ground conductor 816B being on an opposite side of the dielectric substrate 818B from the circuit elements). The example dielectric substrates in FIGS. 8A-8B can be sapphire, silicon, or another dielectric material. The example circuit elements and ground planes in FIGS. 8A-8B can include conducting material in one or more layers on the dielectric substrate. The conducting material on the dielectric substrate can include superconducting material, such as, for example, aluminum, niobium, metal alloys or a combination of these and other types of materials. In some implementations, the example quantum circuit systems 800A, 800B act as parametric amplifier systems that include an amplifier circuit (the JPA 808) and an impedance matching circuit (the impedance matching circuit device 812). The example quantum circuit systems 800A, 800B may include or be connected with other circuit devices, such as, for example, one or more qubit devices.

The example JPAs shown in FIGS. 8A-8B are examples of quantum circuit devices that include Josephson junctions in a SQUID loop. The Josephson junctions may be formed, for example, by aluminum oxide material sandwiched between regions of aluminum superconducting material; other materials may be used in some cases. Each respective JPA 808A, 808B includes a DC bias loop, a SQUID, and a capacitor. In particular, the JPA 808A shown in FIG. 8A includes a DC bias loop 802A, a SQUID loop 804A, and a capacitor 806A; the JPA 808B shown in FIG. 8B includes a DC bias loop 802B, a SQUID loop 804B, and a capacitor 806B. In some implementations, a DC signal provided to the DC bias loop is used to tune the flux through the SQUID loop, which may in turn tune the resonant frequency of the JPA. The example impedance matching circuit device of each quantum circuit system 800A, 800B is implemented as a ladder network of inductors and shunt capacitors, similar to the impedance matching circuit device 700 of FIG. 7, and serves to impedance match between the input line 814A, 814B and the JPA 808A, 808B, which may allow for an increase in the bandwidth of signals communicated to (via intermediate line 810A, 810B) and amplified by the JPA. For example, in some instances, the impedance matching circuit device may allow for an amplification bandwidth of approximately 1 GigaHertz (GHz) for the JPA as opposed to an amplification bandwidth of approximately 10 MegaHertz (MHz) without the impedance matching circuit device.

In the example shown in FIG. 8A, the JPA 808A and the impedance matching circuit device 812A each include conductive material in an interior clearance area defined by the ground conductor 816A. In contrast, in the example shown in FIG. 8B, the ground conductor 816B resides on a first side of the dielectric substrate 818B, while the other circuit components reside on a second side of the dielectric substrate 818B opposite the first side in a microstrip topology. In the example quantum circuit system 800B, vias 820 extending through the thickness of the dielectric substrate 818B connect the ground conductor 816A to circuit components on the opposite side of the dielectric substrate 818B. For example, as shown on the right side of FIG. 8B, a conductor of the capacitor 806B is connected to the ground conductor 816B by a via 820.

Figure 9:
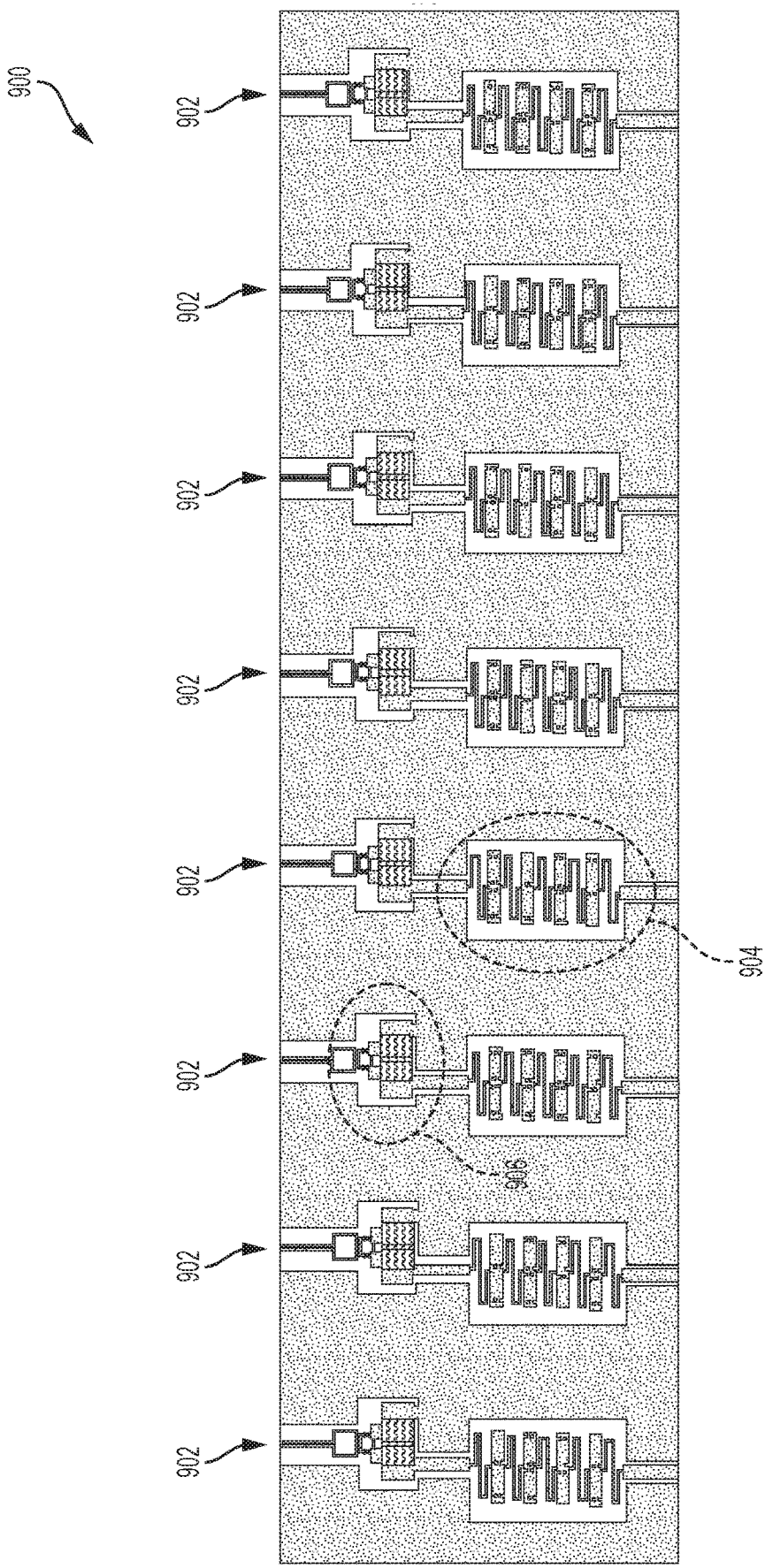
FIG. 9 is a diagram of an example layout of an array of quantum circuit systems.

FIG. 9 is an example layout of an array 900 of quantum circuit systems 902. The example array 900 includes an array of impedance matching circuit devices each coupled to a respective quantum circuit device on the same substrate. In particular, each example quantum circuit system 902 includes an impedance matching circuit device 904 coupled to a JPA 906. Each quantum circuit system 902 may be similar to the quantum circuit system 800A of FIG. 8A. As shown, multiple quantum circuit systems 902 may be integrated in an array 900 on the same substrate. In the example shown, the impedance matching circuit devices 904 are on the same substrate as the JPAs 906. Each of the example quantum circuit systems 902 may include or be connected with other circuit devices, such as, for example, one or more qubit devices. For instance, each quantum circuit system 902 can be routed to another quantum circuit system 902 or other circuitry at this level, which may facilitate larger system building blocks to be built and connected.

Figure 10:
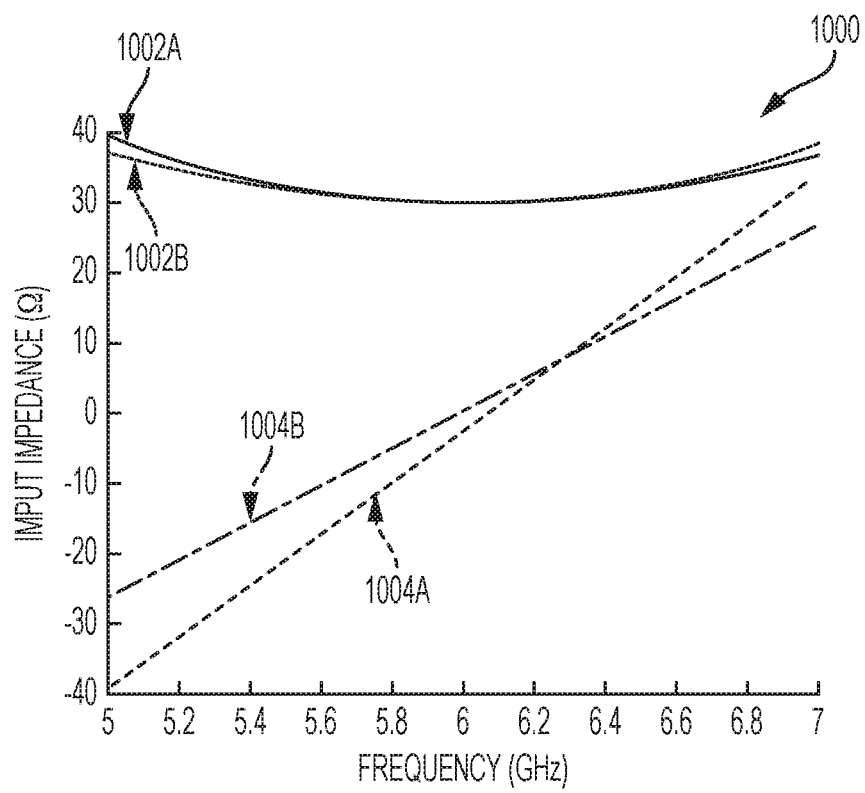
FIG. 10 is a plot showing real and imaginary components of an impedance of the example impedance matching circuit of FIG. 7.

FIG. 10 is a plot 1000 showing real and imaginary components of an impedance of the example impedance matching circuit device 700 of FIG. 7. In particular, the plot 1000 includes traces 1002A and 1004A representing ideal values of the real and imaginary components, respectively, of the impedance of the impedance matching circuit device 700, and traces 1002B and 1004B representing simulated values of the real and imaginary components, respectively, of the impedance of the example impedance matching circuit device 700. The ideal values of traces 1002A, 1004A are based on ideal impedance matching circuit inductance and capacitance values of 3.33 nanohenries (nH) and 0.21 picofarads (pF), respectively (e.g., for the inductor 508 and capacitor 510 of the model impedance matching circuit 506 shown in FIG. 5). The values of traces 1002B, 1004B are based on inductance and capacitance values of 0.5 nH and 80 femtofarads (fF), respectively, extracted from numerical models simulating the example layout shown in FIG. 7 using 13 unit cells. The data shown in FIG. 10 demonstrates that, in some cases, the example layout shown in FIG. 7 provides an appropriate way to integrate an impedance matching circuit on the same substrate as a quantum circuit.

Figure 11:
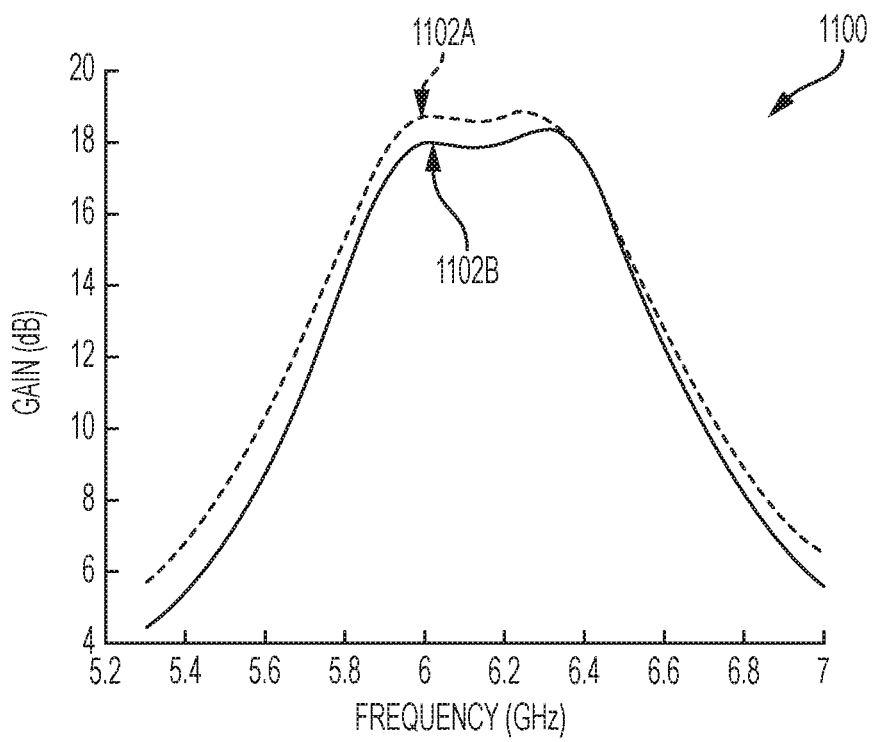
FIG. 11 is a plot showing a gain of the example quantum circuit system of FIG. 8A.

FIG. 11 is a plot 1100 showing a gain of the example quantum circuit system 800A of FIG. 8A. In particular, the plot 1100 includes trace 1102A representing ideal values of the gain of the quantum circuit system 800A, and trace 1102B representing simulated values of the gain of the quantum circuit system 800A. The ideal values of traces 1102A are based on ideal impedance matching circuit inductance and capacitance values of 3.33 nH and 0.21 pF, respectively (e.g., for the inductor 508 and capacitor 510 of the model impedance matching circuit 506 shown in FIG. 5 in place of impedance matching circuit device 812A of FIG. 8A), an inductance value of 0.12 nH for the SQUID loop 804A of FIG. 8A, and a capacitance value of 3.4 pF for the capacitor 806A of FIG. 8A. The values of trace 1102B are based on inductance and capacitance values of 0.5 nH and 80 fF, respectively, extracted from numerical models simulating the example layout shown in FIG. 7 using 13 unit cells for impedance matching circuit device 812A of FIG. 8A, an inductance value of 0.12 nH for the SQUID loop 804A of FIG. 8A, and a capacitance value of 3.4 pF for the capacitor 806A of FIG. 8A. The data shown in FIG. 11 demonstrates that, in some cases, an impedance matching circuit on the same substrate as a quantum circuit is useful at broadening the bandwidth of the quantum circuit. As shown in FIG. 11, the JPA 808A of FIG. 8A may be configured to provide a gain of at least four (4) dB (and up to 15 dB) to microwave signals over a bandwidth greater than five hundred (500) MHz, and may be configured to provide gain to microwave signals having a nominal frequency between four (4) and ten (10) GHz. The nominal frequency can be, for instance, a center or other primary frequency of the microwave signal, and the microwave signal may have a distribution of frequencies about the primary frequency. The bandwidth of the microwave signal can be, for instance, the full width at half maximum (FWHM) of the microwave signal, or another measure of frequency bandwidth can be used.

In a general aspect of the examples described here, an impedance matching circuit device is coupled to a quantum circuit device on a substrate.

In a first example, a microwave quantum circuit system includes a dielectric substrate, a quantum circuit device on the dielectric substrate, and an impedance matching circuit device on the dielectric substrate. The quantum circuit device includes a Josephson junction, and the impedance matching circuit device is coupled to the quantum circuit device.

Implementations of the first example may include one or more of the following features. The quantum circuit device may include a qubit device. The quantum circuit device may include a parametric amplifier. The parametric amplifier may be a Josephson parametric amplifier. The parametric amplifier may be configured to provide a gain of at least four (4) dB to microwave signals over a bandwidth of greater than five hundred (500) MHz. The parametric amplifier may be configured to provide gain to microwave signals having a nominal frequency between four (4) and ten (10) GHz. The quantum circuit device may further include a shunting circuit element. The quantum circuit device may include a superconducting quantum interference device (SQUID), and the SQUID may include multiple Josephson junctions.

Implementations of the first example may include one or more of the following features. The impedance matching circuit device may include a ladder network of inductors and shunt capacitors. The impedance matching circuit device may include a series of circuit unit cells, and each circuit unit cell may include an inductor and a capacitor. The impedance matching circuit device may be configured to communicate microwave signals to the quantum circuit device, the microwave signals having a bandwidth of greater than five hundred (500) MHz.

Implementations of the first example may include one or more of the following features. The microwave quantum circuit system may include a ground conductor. The quantum circuit device and the impedance matching circuit device may reside in an interior clearance area defined by the ground conductor. The quantum circuit device, the impedance matching circuit device, and the ground conductor may each be on a first side of the dielectric substrate in a coplanar waveguide topology. The ground plane conductor may be on a first side of the dielectric substrate, and the quantum circuit device and the impedance matching circuit device may each be on a second side of the dielectric substrate opposite the first side in a microstrip topology. The ground conductor may define an interior clearance area, and the impedance matching circuit device may include inductors and capacitors. The inductors may include meandered conductive traces within the interior clearance area, and the capacitors may include conductive traces forming interdigitated gaps between meandered conductive traces. The ground conductor may define an interior clearance area, and the impedance matching circuit device may include a first meandered conductive trace formed within the interior clearance area, a second meandered conductive trace formed within the interior clearance area, and one or more conductive traces forming interdigitated gaps between the first and second meandered conductive traces. The ground conductor may have an interior boundary defining an interior clearance area, and the impedance matching circuit device may include conductive traces extending in a first direction from the interior boundary of the ground conductor. The elongate conductive traces may be spaced apart from each other in a second direction perpendicular to the first direction, and the impedance matching circuit device may include meandered conductive traces between the elongate conductive traces. The ground conductor may define an interior clearance area, and the impedance matching circuit device may include meandered conductive traces and elongate conductive traces within the interior clearance area. The longest spatial dimension of the meandered conductive traces may be parallel to the longest spatial dimension of the elongate conductive traces.

Implementations of the first example may include one or more of the following features. The microwave quantum circuit system may include an array of quantum circuit devices on the dielectric substrate, and each quantum circuit device may include a Josephson junction. The microwave quantum circuit system may include an array of impedance matching circuit devices on the dielectric substrate, and each impedance matching circuit device may be coupled to a respective one of the quantum circuit devices.

In a second example, a method for processing quantum information includes receiving a microwave signal at an impedance matching circuit device on a dielectric substrate, and communicating the microwave signal to a quantum circuit device coupled to the impedance matching circuit device on the substrate. The quantum circuit device may include a Josephson junction.

Implementations of the second example may include one or more of the following features. The microwave signal may have a nominal frequency between four (4) and ten (10) GHz. The microwave signal communicated to the quantum circuit device may have a bandwidth of greater than five hundred (500) MHz. Transmitting the microwave signal to the quantum circuit device may include transmitting the microwave signal to a qubit device. Transmitting the microwave signal to the quantum circuit device may include transmitting the microwave signal to a parametric amplifier. Transmitting the microwave signal to the quantum circuit device may include transmitting the microwave signal to a superconducting quantum interference device (SQUID), and the SQUID may include multiple Josephson junctions.

In a third example, a quantum computing system include a qubit device on a substrate, a parametric amplifier on the substrate, and an impedance matching circuit device on the substrate. The parametric amplifier includes a Josephson junction, and the impedance matching circuit device is coupled to the qubit device and the parametric amplifier.

Implementations of the third example may include one or more of the following features. The parametric amplifier may be a Josephson parametric amplifier. The quantum computing system may include a control system configured to send microwave signals to the qubit device. The control system may include a digitizer that receives an output from the parametric amplifier and generates a digital signal based on the output. The control system may include a computer system that receives the digital signal from the digitizer. The control system may include a pump tone source that provides a pump tone signal to the parametric amplifier.

Implementations of the third example may include one or more of the following features. The quantum computing system may include an array of qubit devices on the substrate. The quantum computing system may include an array of parametric amplifiers on the substrate. Each parametric amplifier may include a Josephson junction. The quantum computing system may include an array of impedance matching circuit devices on the substrate. Each impedance matching circuit device may be coupled to a respective one of the qubit devices and a respective one of the parametric amplifiers.

In a fourth example, a method for processing quantum information includes communicating a readout signal to a qubit device on a substrate, communicating an output of the qubit device to an impedance matching circuit device on the substrate, and communicating the output of the qubit device to a parametric amplifier on the substrate. The parametric amplifier includes a Josephson junction. and the output of the qubit device is based on the readout signal.

Implementations of the fourth example may include one or more of the following features. Communicating the output of the qubit device to the impedance matching circuit device may include communicating the output of the qubit device to a directional coupler. Microwave signals may be received from a control system at the qubit device. An output of the parametric amplifier may be communicated to a digitizer. An output of the digitizer may be communicated to a computer system. A pump tone signal may be communicated to the parametric amplifier.

Implementations of the fourth example may include one or more of the following features. A readout signal may be communicated to an array of qubit devices on the substrate. An output of each qubit device may be communicated to a respective impedance matching circuit device on the substrate. The output of the qubit device may be based on the readout signal. The output of each qubit device may be communicated to a respective parametric amplifier on the substrate. Each parametric amplifier may include a Josephson junction.

In a fifth example, a microwave quantum circuit system includes a dielectric substrate, a quantum circuit device on the dielectric substrate, an input line on the dielectric substrate, and means for impedance matching between the quantum circuit device and the input line. The quantum circuit device includes a Josephson junction.

Implementations of the fifth example may include one or more of the following features. The quantum circuit device may include a qubit device. The quantum circuit device may include a parametric amplifier. The parametric amplifier may be a Josephson parametric amplifier. The parametric amplifier may be configured to provide a gain of at least four (4) dB to microwave signals over a bandwidth of greater than five hundred (500) MHz. The parametric amplifier may be configured to provide gain to microwave signals having a nominal frequency between four (4) and ten (10) GHz. The quantum circuit device may further include a shunting circuit element. The quantum circuit device may include a superconducting quantum interference device (SQUID), and the SQUID may include multiple Josephson junctions.

Implementations of the fifth example may include one or more of the following features. The impedance matching circuit device may include a ladder network of inductors and shunt capacitors. The impedance matching circuit device may include a series of circuit unit cells, and each circuit unit cell may include an inductor and a capacitor. The impedance matching circuit device may be configured to communicate microwave signals to the quantum circuit device, the microwave signals having a bandwidth of greater than five hundred (500) MHz.

Implementations of the fifth example may include one or more of the following features. The microwave quantum circuit system may include a ground conductor. The quantum circuit device and the impedance matching circuit device may reside in an interior clearance area defined by the ground conductor. The quantum circuit device, the impedance matching circuit device, and the ground conductor may each be on a first side of the dielectric substrate in a coplanar waveguide topology. The ground plane conductor may be on a first side of the dielectric substrate, and the quantum circuit device and the impedance matching circuit device may each be on a second side of the dielectric substrate opposite the first side in a microstrip topology. The ground conductor may define an interior clearance area, and the impedance matching circuit device may include inductors and capacitors. The inductors may include meandered conductive traces within the interior clearance area, and the capacitors may include conductive traces forming interdigitated gaps between meandered conductive traces. The ground conductor may define an interior clearance area, and the impedance matching circuit device may include a first meandered conductive trace formed within the interior clearance area, a second meandered conductive trace formed within the interior clearance area, and one or more conductive traces forming interdigitated gaps between the first and second meandered conductive traces. The ground conductor may have an interior boundary defining an interior clearance area, and the impedance matching circuit device may include conductive traces extending in a first direction from the interior boundary of the ground conductor. The elongate conductive traces may be spaced apart from each other in a second direction perpendicular to the first direction, and the impedance matching circuit device may include meandered conductive traces between the elongate conductive traces. The ground conductor may define an interior clearance area, and the impedance matching circuit device may include meandered conductive traces and elongate conductive traces within the interior clearance area. The longest spatial dimension of the meandered conductive traces may be parallel to the longest spatial dimension of the elongate conductive traces.

Implementations of the fifth example may include one or more of the following features. The microwave quantum circuit system may include an array of quantum circuit devices on the dielectric substrate, and each quantum circuit device may include a Josephson junction. The microwave quantum circuit system may include an array of impedance matching circuit devices on the dielectric substrate, and each impedance matching circuit device may be coupled to a respective one of the quantum circuit devices.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

The invention claimed is:

1. A microwave quantum circuit system comprising:
   a dielectric substrate;
   a quantum circuit device on the dielectric substrate, the quantum circuit device comprising a Josephson junction; and
   a linear impedance matching circuit device on the dielectric substrate, the linear impedance matching circuit device coupled to the quantum circuit device and comprising a ladder network of inductors and shunt capacitors;
   wherein the quantum circuit device comprises a parametric amplifier configured to:
   provide a gain of at least (4) dB to microwave signals over a bandwidth greater than five hundred (500) MHz, and
   provide gain to microwave signals having a nominal frequency between four (4) and ten (10) GHz.

2. The system of claim 1, wherein the quantum circuit device comprises a qubit device.

3. The system of claim 1, wherein the parametric amplifier is a Josephson parametric amplifier.

4. The system of claim 1, wherein the quantum circuit device comprises a superconducting quantum interference device (SQUID), the SQUID comprising multiple Josephson junctions.

5. The system of claim 1, wherein the linear impedance matching circuit device comprises a series of circuit unit cells, each circuit unit cell comprising an inductor and a shunt capacitor.

6. The system of claim 1, wherein the linear impedance matching circuit device is configured to communicate microwave signals to the quantum circuit device, the microwave signals having a bandwidth greater than five hundred (500) MHz.

7. The system of claim 1, comprising a ground conductor, wherein the quantum circuit device and the linear impedance matching circuit device reside in an interior clearance area defined by the ground conductor.

8. The system of claim 1, comprising a ground conductor, wherein the quantum circuit device, the linear impedance matching circuit device, and the ground conductor are each on a first side of the dielectric substrate in a coplanar waveguide topology.

9. The system of claim 1, comprising a ground conductor on a first side of the dielectric substrate, wherein the quantum circuit device and the linear impedance matching circuit device are each on a second side of the dielectric substrate opposite the first side in a microstrip topology.

10. The system of claim 1, comprising a ground conductor defining an interior clearance area, the inductors of the linear impedance matching circuit device comprising meandered conductive traces within the interior clearance area, the shunt capacitors of the linear impedance matching circuit device comprising conductive traces forming interdigitated gaps between the meandered conductive traces.

11. The system of claim 1, comprising a ground conductor having an interior boundary defining an interior clearance area, wherein the linear impedance matching circuit device comprises elongate conductive traces extending in a first direction from the interior boundary of the ground conductor, the elongate conductive traces spaced apart from each other in a second direction perpendicular to the first direction, and comprising meandered conductive traces between the elongate conductive traces.

12. The system of claim 1, comprising a ground conductor defining an interior clearance area, wherein the linear impedance matching circuit device comprises meandered conductive traces and elongate conductive traces within the interior clearance area, the longest spatial dimension of the meandered conductive traces being parallel to the longest spatial dimension of the elongate conductive traces.

13. The system of claim 1, comprising:
   an array of quantum circuit devices on the dielectric substrate, each quantum circuit device comprising a Josephson junction; and
   an array of linear impedance matching circuit devices on the dielectric substrate, each linear impedance matching circuit device coupled to a respective one of the quantum circuit devices, each of the linear impedance matching circuit devices comprising a ladder network of inductors and shunt capacitors.

14. A method for processing quantum information, comprising:
receiving a microwave signal at a linear impedance matching circuit device on a dielectric substrate, the linear impedance matching circuit device comprising a ladder network of inductors and shunt capacitors; and
communicating the microwave signal to a quantum circuit device coupled to the linear impedance matching circuit device on the substrate, the quantum circuit device comprising a Josephson junction;
wherein communicating the microwave signal to the quantum circuit device comprises communicating the microwave signal to a parametric amplifier on the dielectric substrate, the parametric amplifier configured to:
provide a gain of at least four (4) dB to microwave signals over a bandwidth greater than five hundred (500) MHz, and
provide gain to microwave signals having a nominal frequency between four (4) and ten (10) GHz.

15. The method of claim 14, wherein the microwave signal has a nominal frequency between four (4) and ten (10) GHz.

16. The method of claim 15, wherein the microwave signal communicated to the quantum circuit device has a bandwidth greater than five hundred (500) MHz.

17. The method of claim 14, wherein communicating the microwave signal to the quantum circuit device comprises communicating the microwave signal to a qubit device.

18. The method of claim 14, wherein communicating the microwave signal to the quantum circuit device comprises communicating the microwave signal to a superconducting quantum interference device (SQUID), the SQUID comprising multiple Josephson junctions.

19. A quantum computing system comprising a quantum circuit system, the quantum circuit system comprising:
a qubit device on a substrate;
a parametric amplifier on the substrate, the parametric amplifier comprising a Josephson junction;
a linear impedance matching circuit device on the substrate, the linear impedance matching circuit device coupled to the qubit device and the parametric amplifier and comprising a ladder network of inductors and shunt capacitors; and
a control system configured to send microwave signals to the qubit device;
wherein the parametric amplifier is configured to provide a gain of at least four (4) dB to microwave signals over a bandwidth greater than five hundred (500) MHz; and
wherein the parametric amplifier is configured to provide gain to microwave signals having a nominal frequency between four (4) and ten (10) GHz.

20. The quantum computing system of claim 19, wherein the parametric amplifier is a Josephson parametric amplifier.

21. The quantum computing system of claim 19, wherein the control system comprises a digitizer that receives an output from the parametric amplifier and generates a digital signal based on the output.

22. The quantum computing system of claim 21, wherein the control system comprises a computer system that receives the digital signal from the digitizer.

23. The quantum computing system of claim 19, wherein the control system comprises a pump tone source that provides a pump tone signal to the parametric amplifier.

24. The quantum computing system of claim 19, the quantum circuit system comprising:
an array of qubit devices on the substrate;
an array of parametric amplifiers on the substrate, each parametric amplifier comprising a Josephson junction; and
an array of linear impedance matching circuit devices on the substrate, each linear impedance matching circuit device coupled to a respective one of the qubit devices and a respective one of the parametric amplifiers, each of the linear impedance matching circuit devices comprising a ladder network of inductors and shunt capacitors.

25. A method for processing quantum information, comprising:
communicating a readout signal to a qubit device on a substrate;
communicating an output of the qubit device to a directional coupler and a linear impedance matching circuit device on the substrate, the output of the qubit device based on the readout signal, the linear impedance matching circuit device comprising a ladder network of inductors and shunt capacitors; and
communicating the output of the qubit device to a parametric amplifier on the substrate, the parametric amplifier comprising a Josephson junction;
wherein the parametric amplifier is configured to provide a gain of at least four (4) dB to microwave signals over a bandwidth greater than five hundred (500) MHz; and
wherein the parametric amplifier is configured to provide gain to microwave signals having a nominal frequency between four (4) and ten (10) GHz.

26. The method of claim 25, comprising receiving microwave signals from a control system at the qubit device.

27. The method of claim 25, comprising communicating an output of the parametric amplifier to a digitizer.

28. The method of claim 27, comprising communicating an output of the digitizer to a computer system.

29. The method of claim 25, comprising communicating a pump tone signal to the parametric amplifier.

30. The method of claim 25, comprising:
communicating a readout signal to an array of qubit devices on the substrate;
communicating an output of each qubit device to a respective linear impedance matching circuit device on the substrate, the output of the qubit device based on the readout signal, each of the respective linear impedance matching circuit devices comprising a ladder network of inductors and shunt capacitors; and
communicating the output of each qubit device to a respective parametric amplifier on the substrate, each parametric amplifier comprising a Josephson junction.

31. A microwave quantum circuit system comprising:
a dielectric substrate;
a quantum circuit device on the dielectric substrate, the quantum circuit device comprising a Josephson junction;
an input line on the dielectric substrate; and
a means for linear impedance matching comprising a ladder network of inductors and shunt capacitors between the quantum circuit device and the input line;
wherein the quantum circuit device comprises a parametric amplifier configured to:
provide a gain of at least four (4) dB to microwave signals over a bandwidth greater than five hundred (500) MHz, and provide gain to microwave signals having a nominal frequency between four (4) and ten (10) GHz.

32. A method for processing quantum information, comprising:
communicating a readout signal to a qubit device on a substrate;
receiving microwave signals from a control system at the qubit device;
communicating an output of the qubit device to a linear impedance matching circuit device on the substrate, the output of the qubit device based on the readout signal, the linear impedance matching circuit device comprising a ladder network of inductors and shunt capacitors; and
communicating the output of the qubit device to a parametric amplifier on the substrate, the parametric amplifier comprising a Josephson junction;
wherein the parametric amplifier is configured to provide a gain of at least four (4) dB to microwave signals over a bandwidth greater than five hundred (500) MHz; and
wherein the parametric amplifier is configured to provide gain to microwave signals having a nominal frequency between four (4) and ten (10) GHz.

33. The method of claim 32, wherein communicating the output of the qubit device to the linear impedance matching circuit device comprises communicating the output of the qubit device to a directional coupler.

34. The method of claim 32, comprising communicating an output of the parametric amplifier to a digitizer.

35. The method of claim 34, comprising communicating an output of the digitizer to a computer system.

36. The method of claim 32, comprising communicating a pump tone signal to the parametric amplifier.

37. The method of claim 32, comprising:
communicating a readout signal to an array of qubit devices on the substrate;
communicating an output of each qubit device to a respective linear impedance matching circuit device on the substrate, the output of the qubit device based on the readout signal, each of the respective linear impedance matching circuit devices comprising a ladder network of inductors and shunt capacitors; and
communicating the output of each qubit device to a respective parametric amplifier on the substrate, each parametric amplifier comprising a Josephson junction.

38. A method for processing quantum information, comprising:
communicating a readout signal to a qubit device on a substrate;
communicating an output of the qubit device to a linear impedance matching circuit device on the substrate, the output of the qubit device based on the readout signal, the linear impedance matching circuit device comprising a ladder network of inductors and shunt capacitors;
communicating the output of the qubit device to a parametric amplifier on the substrate, the parametric amplifier comprising a Josephson junction; and
communicating an output of the parametric amplifier to a digitizer;
wherein the parametric amplifier is configured to provide a gain of at least four (4) dB to microwave signals over a bandwidth greater than five hundred (500) MHz; and
wherein the parametric amplifier is configured to provide gain to microwave signals having a nominal frequency between four (4) and ten (10) GHz.

39. The method of claim 38, wherein communicating the output of the qubit device to the linear impedance matching circuit device comprises communicating the output of the qubit device to a directional coupler.

40. The method of claim 38, comprising receiving microwave signals from a control system at the qubit device.

41. The method of claim 38, comprising communicating an output of the digitizer to a computer system.

42. The method of claim 38, comprising communicating a pump tone signal to the parametric amplifier.

43. The method of claim 38, comprising:
communicating a readout signal to an array of qubit devices on the substrate;
communicating an output of each qubit device to a respective linear impedance matching circuit device on the substrate, the output of the qubit device based on the readout signal, each of the respective linear impedance matching circuit devices comprising a ladder network of inductors and shunt capacitors; and
communicating the output of each qubit device to a respective parametric amplifier on the substrate, each parametric amplifier comprising a Josephson junction.

* * * * *

UNITED STATES PATENT AND TRADEMARK OFFICE
CERTIFICATE OF CORRECTION

PATENT NO. : 10,740,688 B2
APPLICATION NO. : 15/377005
DATED : August 11, 2020
INVENTOR(S) : Selvanayagam et al.

Page 1 of 1

It is certified that error appears in the above-identified patent and that said Letters Patent is hereby corrected as shown below:

In the Claims

Column 18, Line 1, In Claim 1, after "least", insert -- four --.

Signed and Sealed this
Thirteenth Day of October, 2020

Andrei Iancu
*Director of the United States Patent and Trademark Office*